(12) United States Patent
Lee et al.

(10) Patent No.: US 7,417,525 B2
(45) Date of Patent: Aug. 26, 2008

(54) HIGH EFFICIENCY INDUCTOR, METHOD FOR MANUFACTURING THE INDUCTOR, AND PACKAGING STRUCTURE USING THE INDUCTOR

(75) Inventors: Moon Chul Lee, Yongin-si (KR); Jong Oh Kwon, Suwon-si (KR); Woon Bae Kim, Suwon-si (KR); Jun Sik Hwang, Yongin-si (KR); Chang youl Moon, Suwon-si (KR); In Sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 100 days.

(21) Appl. No.: 11/416,311

(22) Filed: May 3, 2006

(65) Prior Publication Data

US 2007/0085648 A1 Apr. 19, 2007

(30) Foreign Application Priority Data

Oct. 19, 2005 (KR) .................... 10-2005-0098595

(51) Int. Cl.
*H01F 5/00* (2006.01)
*H01F 27/02* (2006.01)

(52) U.S. Cl. ............... 336/200; 336/223; 336/232; 336/83

(58) Field of Classification Search ........... 336/200, 336/223, 232; 257/701–703, 774, 758
See application file for complete search history.

(56) References Cited

U.S. PATENT DOCUMENTS

| 4,477,828 | A | * | 10/1984 | Scherer .................... 257/687 |
| 6,446,327 | B2 | | 9/2002 | Ahn et al. |
| 6,531,945 | B1 | * | 3/2003 | Ahn et al. ................ 336/200 |
| 6,859,129 | B2 | * | 2/2005 | Tsai et al. ................ 336/200 |
| 7,067,397 | B1 | * | 6/2006 | Chang-Chien et al. ...... 438/459 |
| 7,091,599 | B2 | * | 8/2006 | Fujimori .................... 257/692 |

* cited by examiner

*Primary Examiner*—Anh T Mai
(74) *Attorney, Agent, or Firm*—Sughrue Mion, PLLC

(57) ABSTRACT

An inductor is provided which includes a plurality of via holes vertically passing through a substrate, the substrate having insulating properties, vertical conductive portions filling the via holes, and horizontal conductive portions connecting each individual vertical conductive portions at the top and the bottom of the substrate to form a single coil structure with the vertical conductive portions.

16 Claims, 10 Drawing Sheets

HIGH EFFICIENCY INDUCTOR, METHOD FOR MANUFACTURING THE INDUCTOR, AND PACKAGING STRUCTURE USING THE INDUCTOR

CROSS-REFERENCE TO RELATED APPLICATIONS

This application claims priority from Korean Patent Application No. 10-2005-98595, filed on Oct. 19, 2005, in the Korean Intellectual Property Office, the disclosure of which is incorporated herein in its entirety by reference.

BACKGROUND OF THE INVENTION

1. Field of the Invention

The present invention relates to an inductor, and more particularly, to a spiral inductor having a micro size and high efficiency, a method of manufacturing the inductor, and a device package structure using the inductor as a packaging element.

2. Description of the Related Art

An inductor is one of the most important components forming an electric circuit, along with a resistor, a condenser, an electron tube, a transistor, and a power source, and has a coil structure in which copper or aluminum is wound in the shape of a screw several times. The inductor can suppress a sudden change of a current by inducing voltage in proportion to the amount of a current change. In this case, inductance is a ratio of counter-electromotive force generated due to electromagnetic induction according to a change of current flowing into a circuit, or a ratio of an electromotive force generated in the coil to the amount of current flowing over time into a coil. The sign of the inductor is displayed as "L" according to the first letter of linkage designating magnetic coupling.

In the case that one side of an inductor is suddenly disconnected while a current flows through the inductor, the current immediately becomes 0 and a very high voltage is generated, thereby generating a spark in the disconnected portion of a circuit. By using this theory, an inductor is used as a filter controlling a sudden change of a current and filters electric noise in various electronic appliances, oscillation circuits, and current storage devices of a power circuit.

Generally, an inductor is also used in an integrated chip (IC) or MMIC for communication. In particular, as system-on-chip (SOC) technology has advanced, a packaging technology for unification of several devices is currently being developed. Therefore, an inductor having a micro structure and excellent properties, whose manufacturing cost is low, is required.

FIG. 1 is a photograph illustrating an inductor used in a conventional IC device. Referring to FIG. 1, a conventional inductor has a structure floating on a substrate and has a coil structure in approximately the shape of a square. In order to embody the coil structure on a flat surface, a part of the coil structure is vertically separated from and passes under other parts of the coil structure floating over the substrate.

In addition, inductors in various structures may be provided on a chip. However, in view of conventional inductors requiring a considerable amount of space for installation and difficulty in manufacturing conventional inductors due to their complex coil structure, conventional inductors have a low quality factor. Particularly, in the case that many devices have to be embodied on one wafer, a process of manufacturing other devices together may be difficult due to an inductor and there is also a difficulty of embodying a packaging of a device. Also, as shown in FIG. 1, since the coil structure of the inductor has a separated space, an extremely difficult process is required, and there is a problem of generating adhesion for performing wet etching for floating the structure. In addition, a failure of the floated structure caused by external impact easily occurs and stiffness is low.

SUMMARY OF THE INVENTION

The present invention provides an inductor capable of embodying microminiaturization and having excellent properties.

The present invention also provides an inductor having a high quality factor in a small space and can be manufactured easily and inexpensively.

The present invention also provides an inductor having durability against an external impact.

The present invention also provides an inductor having easy packaging design and chip design.

The present invention also provides an inductor capable of being formed together with other devices, whose packaging is completed with installation of the inductor.

According to an aspect of the present invention, there is provided an inductor including a plurality of first horizontal conductive portions, a plurality of second horizontal conductive portions, and a plurality of vertical conductive portions connected in a coil structure to three-dimensionally pass through a substrate. To manufacture the inductor, a plurality of via holes are formed, and by filling the via holes with conductive materials, the vertical conductive portions for electrically connecting the top and the bottom of the substrate are formed. In this case, the substrate may have insulating properties against the vertical conductive portions and the first and second horizontal conductive portions. For this, the substrate may be composed of high resistance silicone or an additional insulation process may be performed on the surface of the substrate.

After forming the vertical conductive portions, ends of the vertical conductive portions, which are exposed at the top and the bottom of the substrate, may be connected by the first and second horizontal conductive portions. The first and second horizontal conductive portions are for forming a single coil structure by connecting the vertical conductive portions. Generally, the vertical conductive portions across from each other are connected to each other in an alternating fashion to form a coil structure having a section approximately in the shape of a square. In the case that the via holes are disposed in two rows at a uniform interval, the horizontal conductive portions at the top are parallel to the horizontal conductive portions at the bottom. However, in the case the interval between the via holes is not uniform, the horizontal conductive portions are not parallel to each other and may be formed in a structure similar to being parallel.

As described above, a single coil structure may be formed by the vertical conductive portions and the first and second horizontal conductive portions, and the coil structure may function as an inductor by connecting both ends of the coil structure to a circuit of another substrate. Since the inductor forms a three-dimensional structure by using the substrate as a body, the inductor may have strong durability against an external impact, and may have a high quality factor in contrast to conventional inductors. Since a process of manufacturing the inductor does not require a high degree of difficulty, the inductor may be manufactured simply and at a low price. Particularly, if the substrate of the inductor is used as a cover of a packaging, since the packaging can be completed simultaneously with installing the inductor, it may be easy to design the packaging.

To form the first and second horizontal conductive portions, conventional methods such as vapor-deposition or sputtering may be used. To form the vertical conductive portions, a method of plating is used. A method of manufacturing the inductor by plating is as follows.

A lower seed metal layer is formed at the bottom of a substrate formed of high resistance material such as high resistance silicone. The substrate may have electrical insulating properties since the substrate is directly in contact with vertical and first and second horizontal conductive portions.

A plurality of via holes are formed in two rows by etching the substrate from the top of the substrate to the lower seed metal layer by using a dry etching process. The rows defined by the via holes may be disposed on two straight lines parallel to each other. Otherwise, the rows defined by the via holes may be disposed on two lines which are not straight, but, for example, curved, waved, zigzag, etc. After forming the via holes, the vertical conductive portions may be formed in the via holes by electroplating, using the lower seed metal layer as a medium. The plating may be performed by using copper (Cu) or gold (Au), however, copper is usually used in plating. All metals capable of conducting electricity may be used in plating, and may grow from the lower seed metal layer to the entrance of the via holes. If necessary, after the plating metal grows, a flattening process for removing an upper part of the substrate and the plating metal may be performed via chemical mechanical polishing (CMP).

To form first horizontal portions by plating, an upper seed metal layer is formed on the top of the substrate and a first photo etching pattern for forming the first horizontal conductive portions on the top of the upper seed metal layer is manufactured. In this case, the first photo etching pattern may have a pattern space in which two of the vertical conductive portions disposed in two rows, across from each other, are paired and connected to each other. After forming the first photo etching pattern, the first horizontal conductive portions are formed on the upper seed metal layer by electroplating. The periphery of the first horizontal conductive portions may be arranged by removing the first photo etching pattern. After removing the first photo etching pattern, the first horizontal conductive portions may be electrically separated by removing the upper seed metal layer exposed below.

To form second horizontal conductive portions, plating may be performed as described above. Since the lower seed metal layer already exists, the second horizontal conductive portions may be formed by using the lower seed metal layer. The second horizontal conductive portions may provide a coil structure in which the vertical conductive portions and the horizontal conductive portions are connected as one by pairing and by connecting two of the vertical conductive portions, which are not connected by the first horizontal conductive portions.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF THE EXEMPLARY EMBODIMENTS

Figure 1:
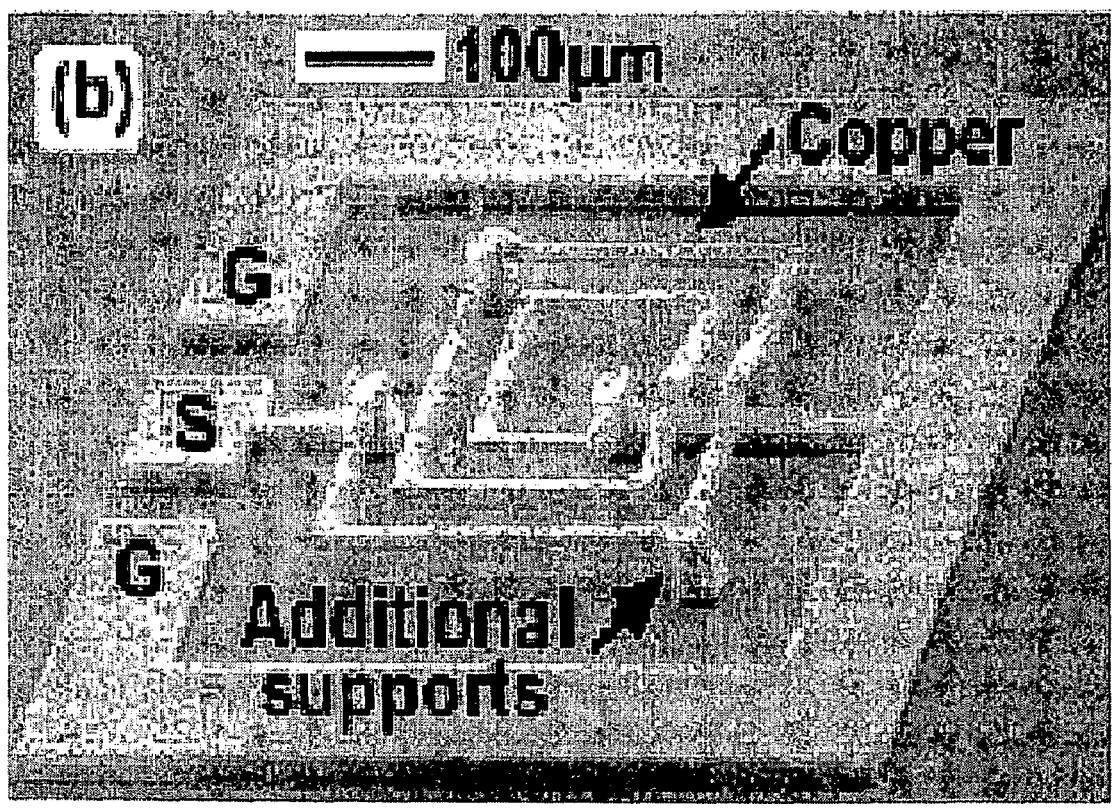
FIG. 1 is a photograph illustrating an inductor used in a conventional IC device.

Reference will now be made in detail to the exemplary embodiments of the present invention, examples of which are illustrated in the accompanying drawings, wherein like reference numerals refer to the like elements throughout. The exemplary embodiments are described below to explain the present invention by referring to the figures.

Figure 2:
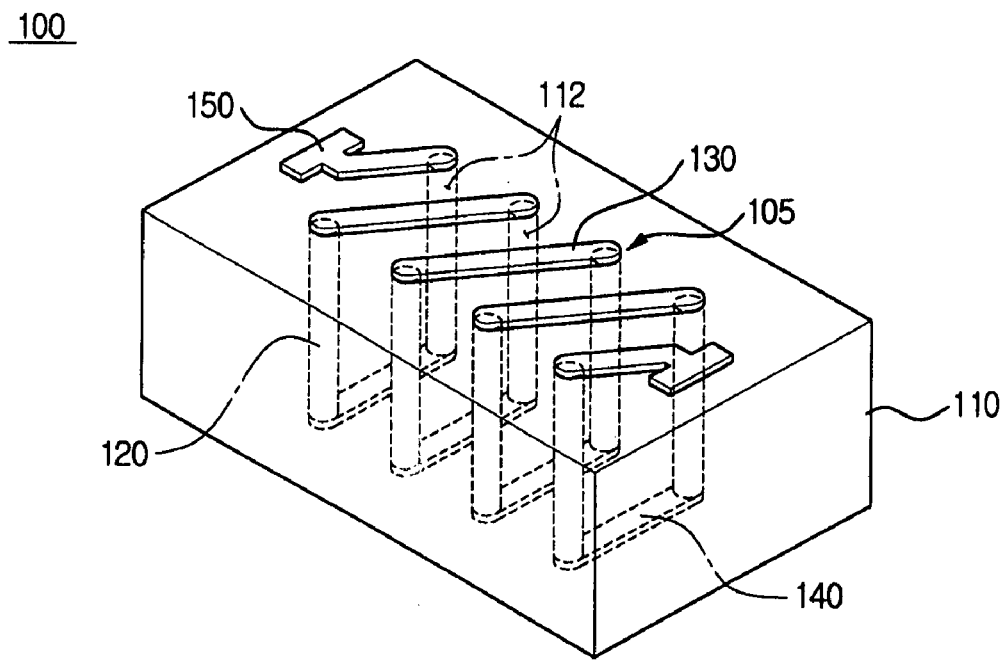
FIG. 2 is a perspective view illustrating an inductor according to an exemplary embodiment of the present invention.

FIG. 2 is a perspective view illustrating an inductor 100 according to an exemplary embodiment of the present invention.

Referring to FIG. 2, the inductor 100 includes a substrate 110, vertical conductive portions 120, first horizontal conductive portions 130, second horizontal conductive portions 140, and electrode portions 150. The vertical conductive portions 120 pass through the body of the substrate 110 and are exposed at the top and the bottom of the body of the substrate 110. The first and second horizontal conductive portions 130 and 140, respectively, electrically connect the exposed vertical conductive portions 120 to provide a single coil structure 105.

Since the substrate 110 is directly in contact with the vertical conductive portions 120 and first and second horizontal conductive portions 130 and 140, the substrate 110 may have insulating properties. Though the substrate 110 is composed of high-resistance silicone so as to have insulating properties in the present embodiment, a substrate may include an insulating-processed surface to have insulating properties. A plurality of via holes 112 are disposed in two rows, and each of the via holes 112 has a structure passing through the body of the substrate 110.

The vertical conductive portions 120 fill the via holes 112 by plating or vapor-depositing. In the case of filling the via hole by plating, the vertical conductive portions 120 may be composed of copper or gold and are disposed at regular intervals and are parallel to each other.

Also, the vertical conductive portions 120 are electrically connected to each other by the first and second horizontal conductive portions 130 and 140. As shown in the illustration, the first horizontal conductive portions 130 at the top pair two vertical conductive portions 120 diagonally across from each other from the vertical conductive portions 120 disposed in two rows. On the other hand, the second horizontal conductive portions 140 at the bottom pair two vertical conductive portions 120 directly across from each other. Accordingly, a plurality of the vertical conductive portions 120 are connected to each other as one, and the vertical conductive portions 120 and the first and second horizontal conductive portions 130 and 140 form the single coil structure 105. The first and second horizontal conductive portions 130 and 140 may be also formed by plating or vapor-depositing. In the case of plating, the first and second horizontal conductive portions 130 and 140 may be composed of copper or gold. The first and second horizontal conductive portions 130 and 140 connect the vertical conductive portions 120 in an alternating fashion to form the coil structure 105 having an approximately square section.

The electrode portions 150 are provided at both ends of the coil structure 105. The electrode portions 150 connect the inductor 100 with a circuit formed at the same or an external substrate and are exposed at the top. Although the electrode portions 150 are exposed at the top in the present exemplary embodiment, the electrode portions 150 may form a via hole passing through the substrate 110 to be connected to a circuit at the bottom and may be extended from the end portion of the coil structure 105 to be connected to another circuit.

Hereinafter, a method of manufacturing the inductor will be described in detail with reference to the attached drawings.

FIGS. 3 through 8 are partial cross-sectional perspective views illustrating a method of manufacturing the inductor according to an exemplary embodiment of the present invention.

Figure 3:
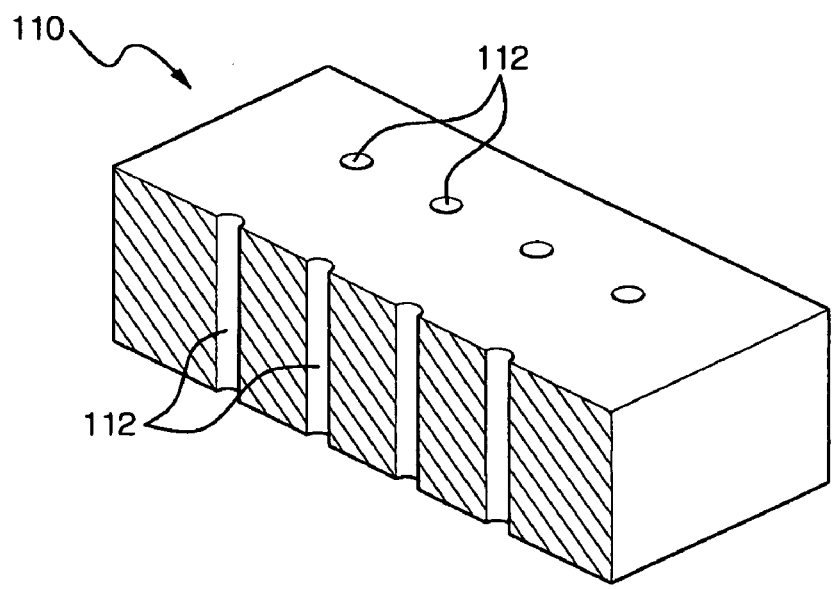
FIGS. 3 through 8 are partial cross-sectional perspective views illustrating a method of manufacturing the inductor according to an exemplary embodiment of the present invention.

Referring to FIG. 3, the substrate 110 composed of high-resistance material is provided and a plurality of via holes 112 are vertically formed in the substrate 110. Also, the via holes 112 are disposed in two rows and formed in the same amount, across from each other, and at uniform intervals. To form the via holes 112 in the substrate 110, a photo etching pattern process and a dry etching process may be used. In this case, dry etching may be performed by using a photo etching pattern as a mask.

In the present exemplary embodiment, since the substrate 110 is composed of high-resistance silicone, the substrate 110 has insulating properties. However, the substrate 110 may have insulating properties by a different insulating process such as by forming an oxide layer.

Figure 4:
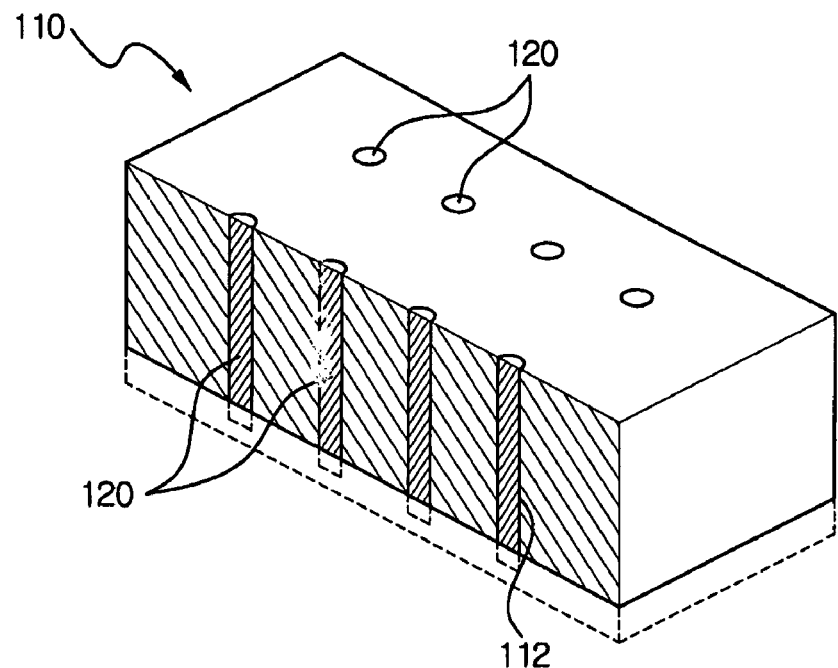

Referring to FIG. 4, the vertical conductive portions 120 are formed by filling the via holes 112 with conductive materials. The vertical conductive portions 120 may be formed by plating. A part shown as a dotted line in FIG. 4 may be a shape of the substrate 110 before flattening.

Figure 5:
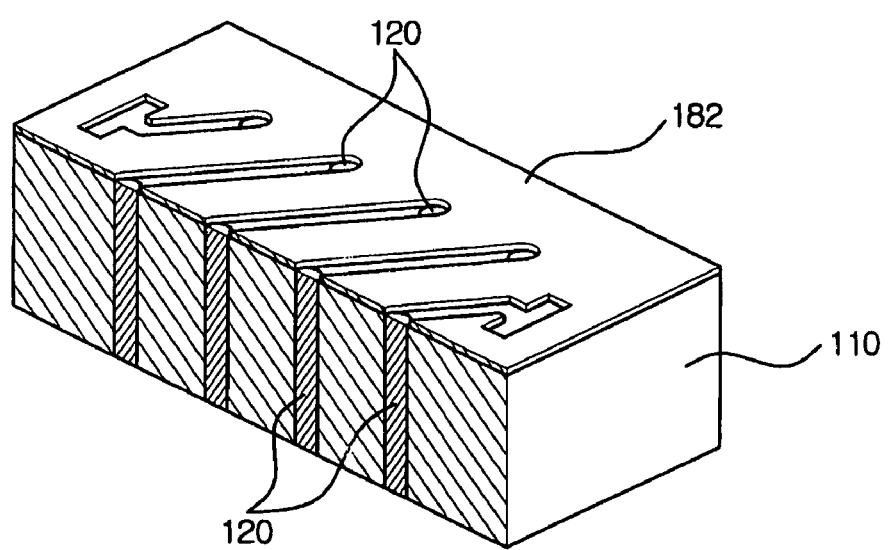

Referring to FIG. 5, a first insulating pattern 182 is formed above the substrate 110. The first insulating pattern 182 has a pattern space corresponding to first horizontal conductive portions 130 connecting the vertical conductive portions 120 diagonally across from each other on the top of the substrate 110 and also has a pattern space corresponding to the electrode portions 150 formed at both ends of a coil structure.

Figure 6:
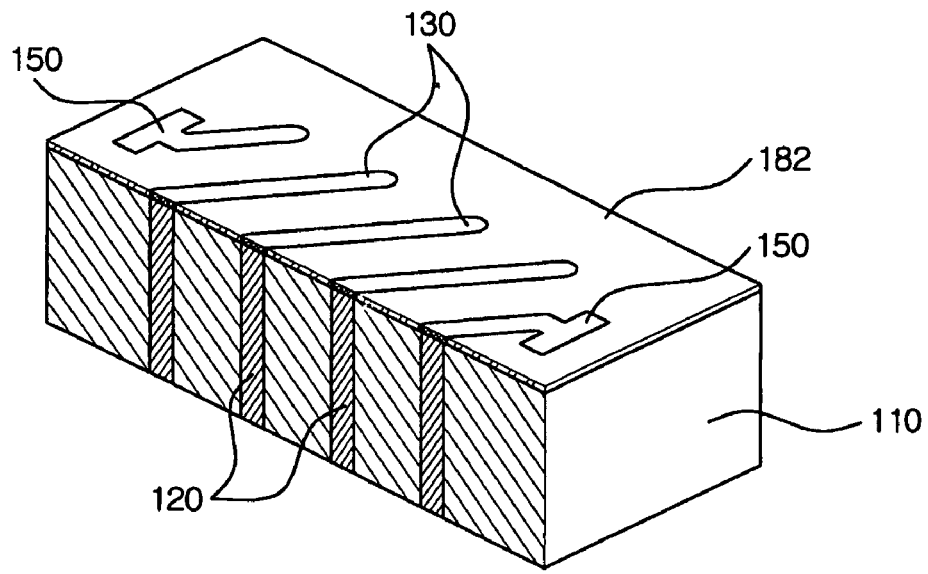

The pattern space for forming the first horizontal conductive portions 130 is disposed approximately flat and the first horizontal conductive portions 130 are provided parallel to the top of the substrate 110. Referring to FIG. 6, the first horizontal conductive portions 130 which are composed of conductive materials are formed at the top of the substrate 110 by using the first insulating pattern 182 as a mask. The first horizontal conductive portions 130 are formed according to the pattern space of the first insulating pattern 182, and upper parts of the vertical conductive portions 120 are electrically connected by the first horizontal conductive portions 130. The first horizontal conductive portions 130 may be formed by vapor-depositing or plating.

Figure 7:
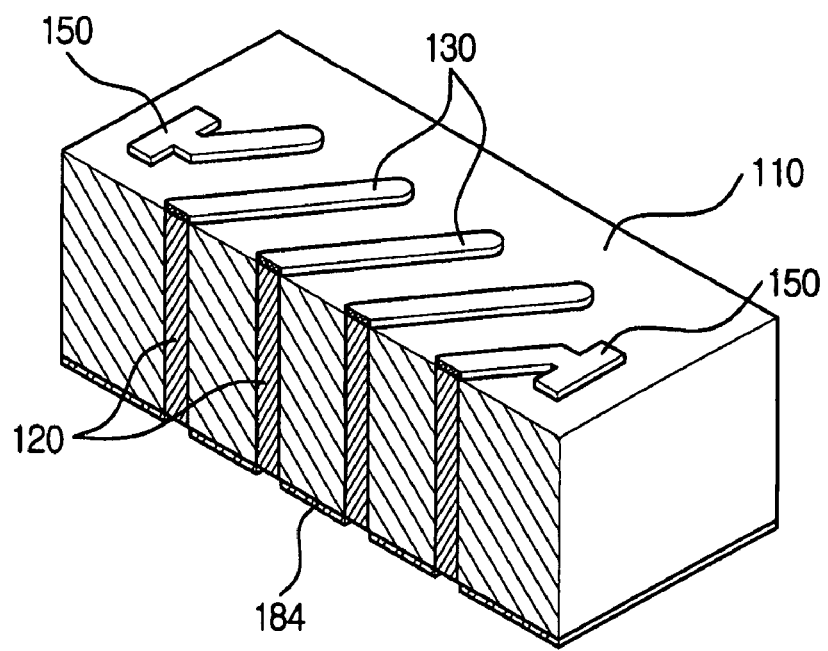

Referring to FIG. 7, a second insulating pattern 184 is formed at the bottom of the substrate 110. The second insulating pattern 184 has a pattern space corresponding to second horizontal conductive portions 140 connecting the vertical conductive portions 120 across from each other at the bottom of the substrate 110. The pattern spaces for forming the second horizontal conductive portions 140 are disposed approximately parallel to each other, and accordingly, the second horizontal conductive portions 140 are provided parallel to the bottom of the substrate 110.

Figure 8:
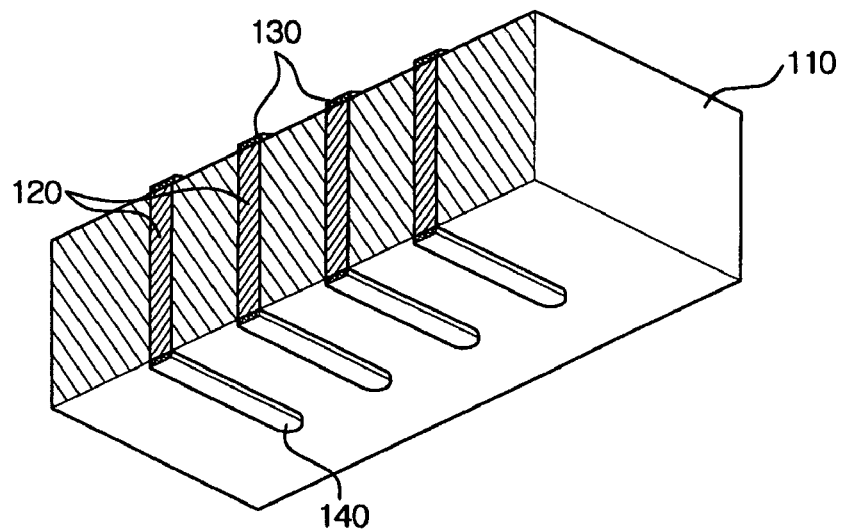

Referring to FIG. 8, the second horizontal conductive portions 140 which are composed of conductive materials are formed at the bottom of the substrate 110 by using the second insulating pattern 184 as a mask. The second horizontal conductive portions 140 are formed according to the pattern space of the second insulating pattern 184, and upper parts of the vertical conductive portions 120 are electrically connected by the second horizontal conductive portions 140. The second horizontal conductive portions 140 may be formed by vapor-depositing or plating.

After forming the second horizontal conductive portions 140, the second insulating pattern 184 may be removed to leave the second horizontal conductive portions 140 on the bottom of the substrate 110, and in some cases, a protective coating layer is formed on the top or the bottom of the substrate to protect the horizontal conductive portions 140.

Figure 9:
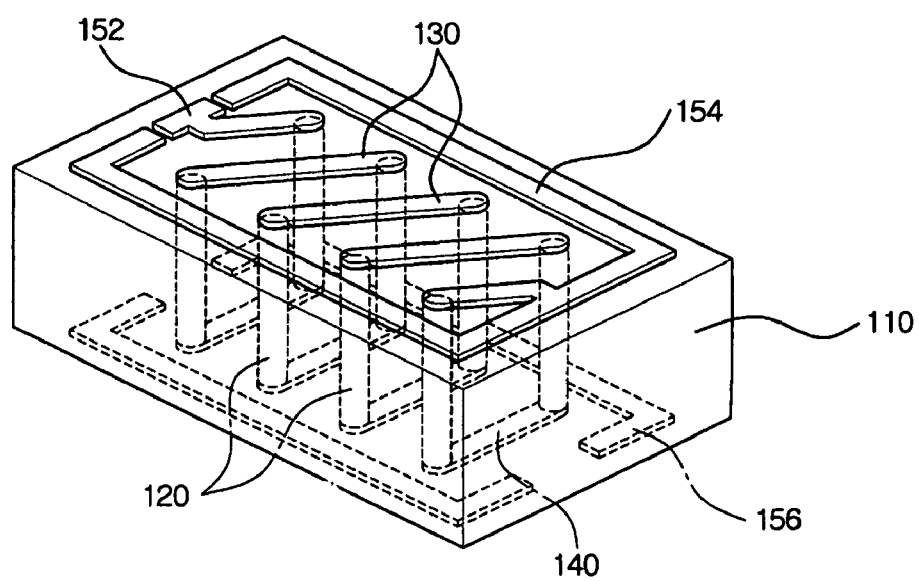
FIG. 9 is a perspective view illustrating an inductor according to an exemplary embodiment of the present invention.

FIG. 9 is a perspective view illustrating an inductor according to an exemplary embodiment of the present invention.

Referring to FIG. 9, in comparison with the inductor 100 of FIG. 2, the inductor 101 further comprises ground electrodes 154 and 156. Since the other elements are approximately identical with the inductor 100, repeated descriptions will be omitted. The ground electrodes 154 and 156 are formed on the top and bottom, respectively, of the substrate 110. The ground electrode 154 on the top is connected to an end of the first horizontal conductive portions 130 forming a part of the coil structure 105. In some cases, the ground electrode 154 at the top may be electrically connected to the ground electrode 156 at the bottom, and one of the ground electrodes 154 and 156 may be connected to an external circuit or a ground.

The inductor 101 includes the substrate 110, the vertical conductive portions 120, the first horizontal conductive portions 130 and second horizontal conductive portions 140, and electrodes 152, 154, and 156. The vertical conductive portions 120 pass through a body of the substrate 110 and are exposed at the top and the bottom. The first and second horizontal conductive portions 130 and 140, respectively, electrically connect the exposed parts of the vertical conductive portions 120 to form the single coil structure 105.

Since the substrate 110 is directly in contact with the vertical conductive portions 120 and the first and second horizontal conductive portions 130 and 140, the substrate 110 may have insulating properties. In the present exemplary embodiment, the substrate 110 is composed of high-resistance silicone. Also, a plurality of via holes 112 are formed in two rows in the substrate 110. The vertical conductive portions 120 fill the via holes 112 by plating or vapor-depositing. The via holes 112 are electrically connected to each other by the first and second horizontal conductive portions 130 and 140. As illustrated, a plurality of vertical conductive portions 120 are connected by the first and second horizontal conductive portions 130 and 140, and the vertical conductive portions 120 and the first and second horizontal conductive portions 130 and 140 form the single coil structure 105. The coil structure 105 has an approximately rectangular cross section.

FIGS. 10 through 17 are cross-sectional views illustrating an inductor and a method of manufacturing the inductor according to an exemplary embodiment of the present invention.

For reference, the inductor according to the present exemplary embodiment has a three-dimensional shape, such as a coil structure, which is the same as the inductor illustrated in FIGS. 2 through 8. In the cross-sectional views illustrated in FIGS. 10 through 17, the three-dimensional structure is schematized into a flat structure, which may be understood by referring to the order of the process.

Figure 10:
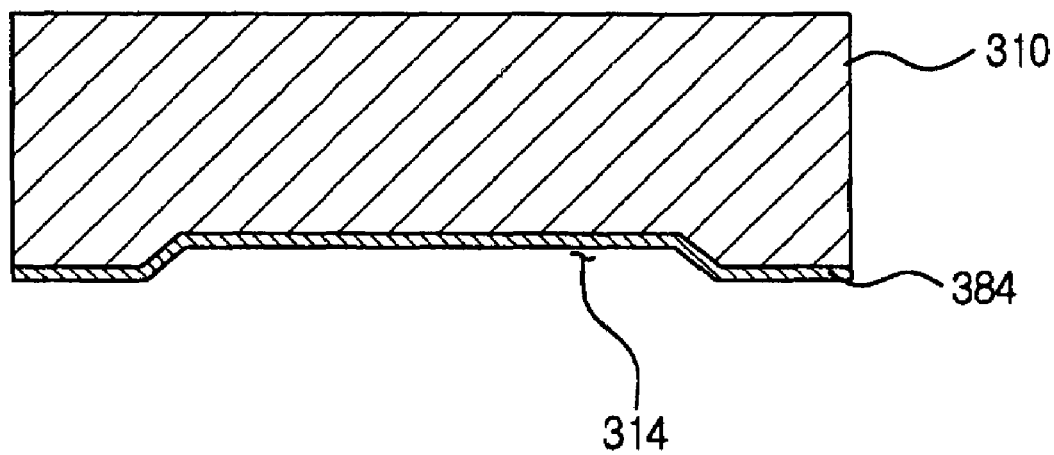
FIGS. 10 through 17 are cross-sectional views illustrating an inductor and a method of manufacturing the inductor according to an exemplary embodiment of the present invention.

Referring to FIG. 10, an upper substrate 310 is a cover covering a base substrate 210, that will be described later, and may hermetically seal an internal device 220 (shown in FIG. 18). Since the upper substrate 310 is composed of high-resistance silicone, the upper substrate has insulating properties. A cavity 314 for containing the device is formed below the upper substrate 310. To form the cavity 314, wet etching may be performed by using tetra methyl ammonium hydroxide (TMAH). The height of the cavity 314 may be controlled by controlling the wet etching.

Also, after forming the cavity 314, a lower seed metal layer 384 is formed at the bottom of the upper substrate 310. The lower seed metal layer 384, serving as a base layer for electroplating, may usually be made of chromium/gold or titanium/copper.

Figure 11:
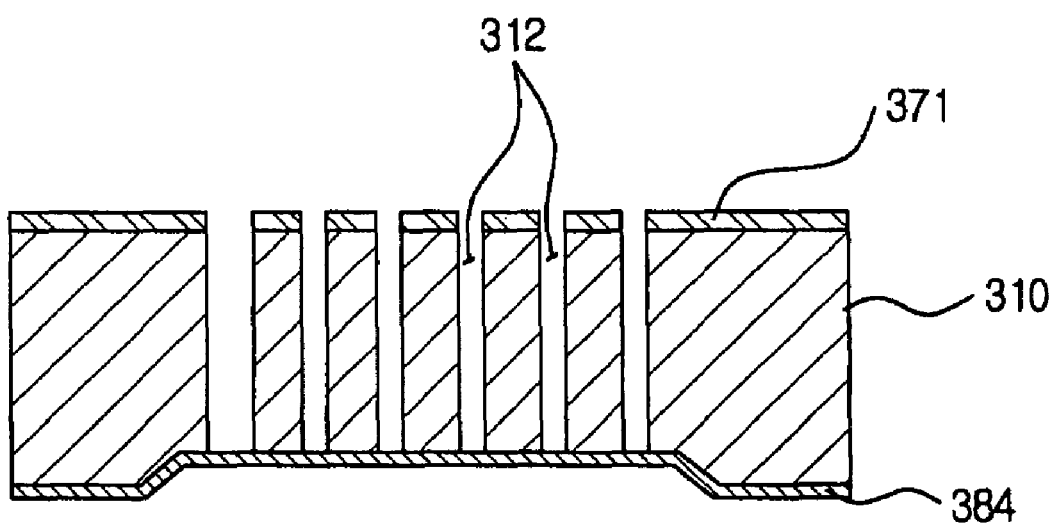

Referring to FIG. 11, a photo etching pattern 371 is formed to form via holes 312. The photo etching pattern 371 may be manufactured via a usual process and includes a pattern for disposing the via holes 312 in two rows. Though not shown, the via holes 312 disposed in the two rows are formed in the same amount, across from each other, and at a uniform interval.

After forming the photo etching pattern 371 on the upper substrate 310, a dry etching process is performed by using the photo etching pattern 371 as a mask. A vertical etching may be performed via the dry etching process, thereby forming the via holes 312 vertically passing through the upper substrate 310. The etching for forming the via holes 312 is performed until the lower seed metal layer 384 is reached. After forming the via holes 312, the photo etching pattern 371 is removed.

In the present exemplary embodiment, since the upper substrate 310 is composed of high-resistance silicone, the upper substrate 310 has insulating properties. However, the upper substrate 310 may have insulating properties by a different insulating process such as by forming an oxide layer.

Figure 12:
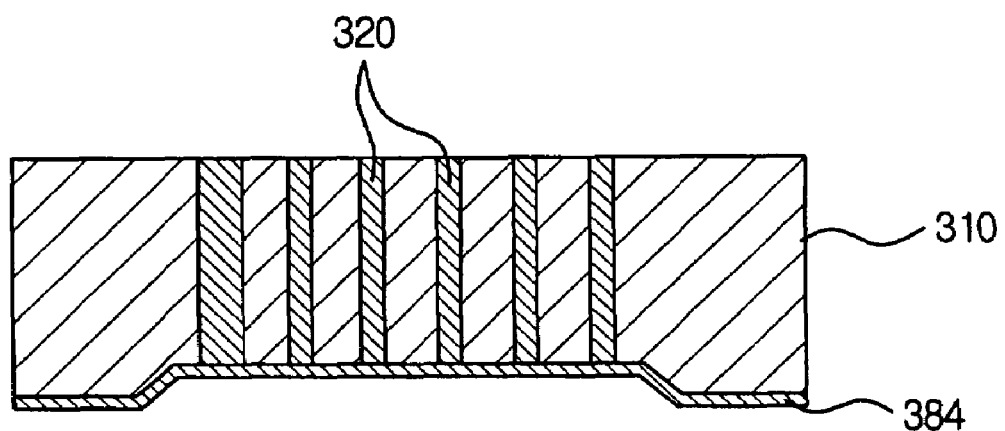

Referring to FIG. 12, the via holes 312 are filled with conductive materials to form vertical conductive portions 320. The vertical conductive portions 320 may be formed by plating. In the present embodiment, electroplating using copper or gold may be performed by using the lower seed metal layer 384 as a medium.

The upper substrate 310 is immersed into a solution including gold ions and the lower seed metal layer 384 is connected to a power source, thereby performing plating. Plating metal grows in the via holes 312 to fill the via holes 312. After filling the via holes 312 by using copper or gold, an upper part of the upper substrate 310 and the plating metal may be removed via a flattening process. The vertical conductive portions 320 may be formed in the via holes 312 via the process.

Figure 13:
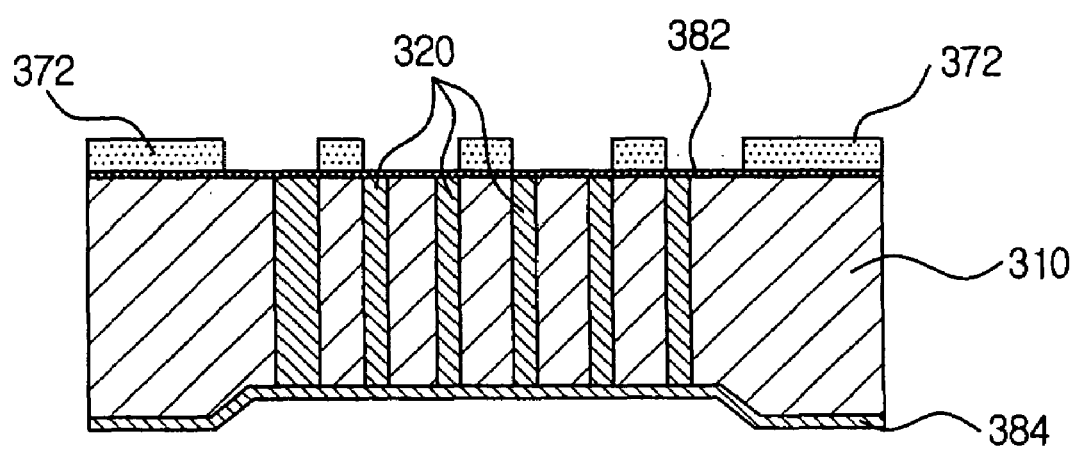

Referring to FIG. 13, an upper seed metal layer 382 may be formed on the upper substrate 310 after forming the vertical conductive portions 320. The upper seed metal layer 382 is also composed of chromium/gold or titanium/copper.

A first photo etching pattern 372 is formed on the upper seed metal layer 382. The first photo etching pattern 372 is for forming first horizontal conductive portions 330 and may be formed in a shape similar to the first insulating pattern 182 of FIG. 5. The first photo etching pattern 372 connects the vertical conductive portions 320 diagonally across from each other on the top of the upper substrate 310 and has a space corresponding to the first horizontal conductive portions 330. Although horizontal conductive portions are formed by vapor-depositing in the first insulating pattern 182, in the present exemplary embodiment, first horizontal conductive portions 330 are formed by electroplating in portions exposed by the first photo etching pattern 372.

Figure 14:
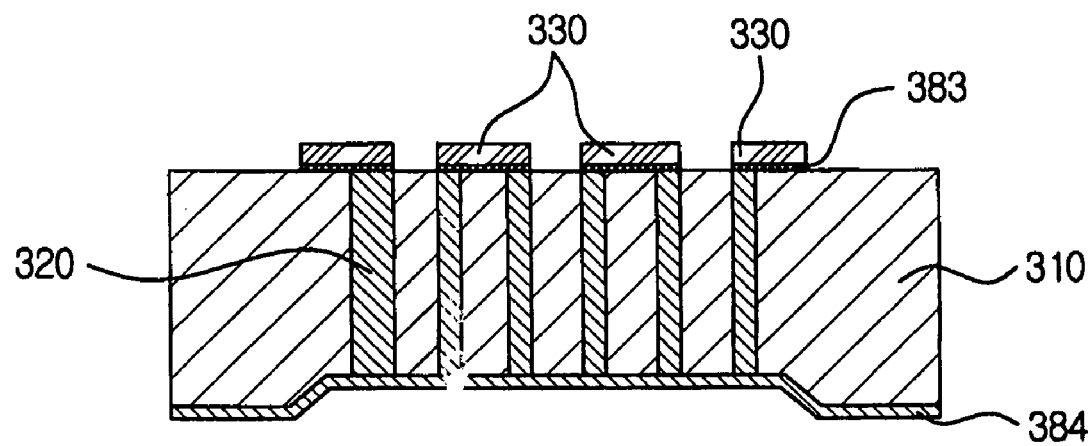

Referring to FIG. 14, after forming first horizontal conductive portions 330, the first photo etching pattern 372 and the upper seed metal layer 382 below the first photo etching pattern 372 are removed. After the upper seed metal layer 382 is removed, an upper seed pattern 383 remains. The upper seed pattern 383 is interposed between the first horizontal conductive portions 330 and the upper substrate 310.

Figure 15:
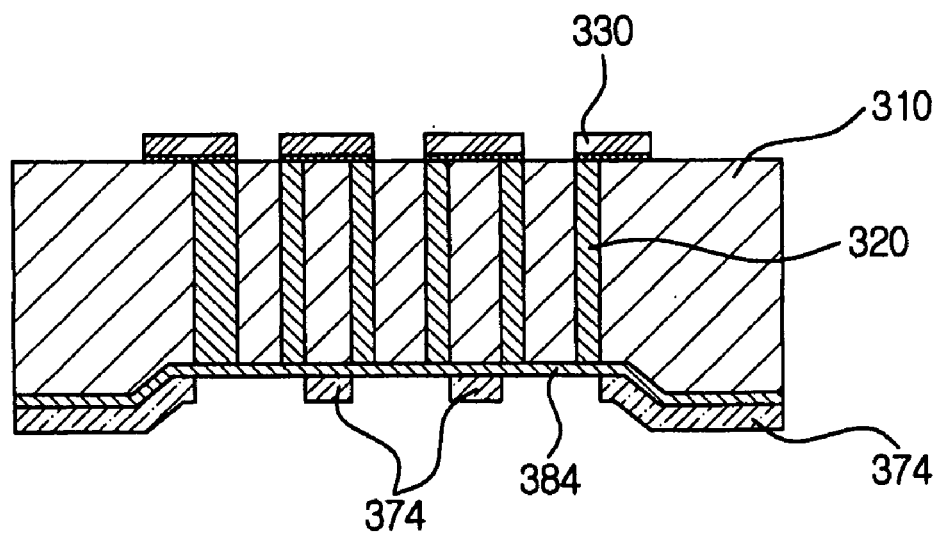
Figure 16:
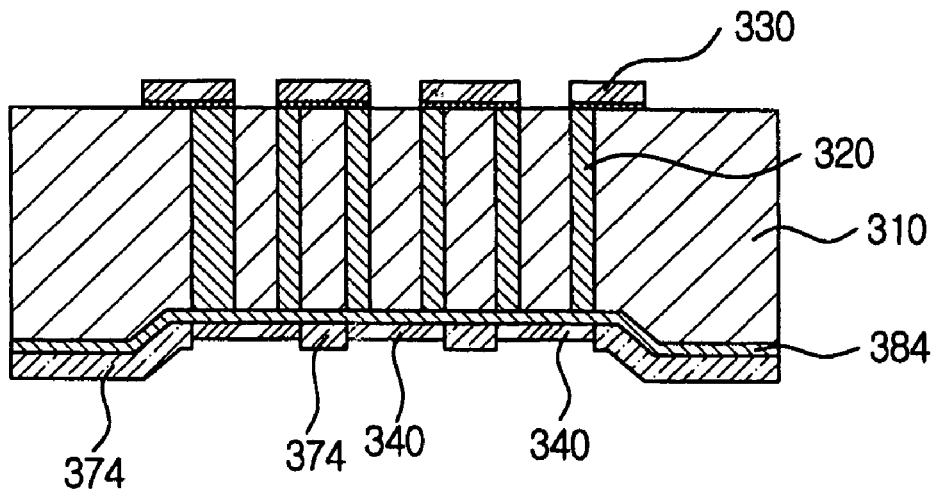

Referring to FIG. 15, a second photo etching pattern 374 is formed below the lower seed metal layer 384. The second photo etching pattern 374 is for forming second horizontal conductive portions 340 and may be formed in a shape similar to the second insulating pattern 184 of FIG. 7. Referring to FIG. 16, plating metal may grow in portions corresponding to the second horizontal conductive portions 340 by using the second photo etching pattern 374. The second horizontal conductive portions 340 may be formed by electroplating. After forming the second horizontal conductive portions 340, the vertical conductive portions 320, the first horizontal conductive portions 330 and the second horizontal conductive portions 340 form a single coil structure.

Figure 17:
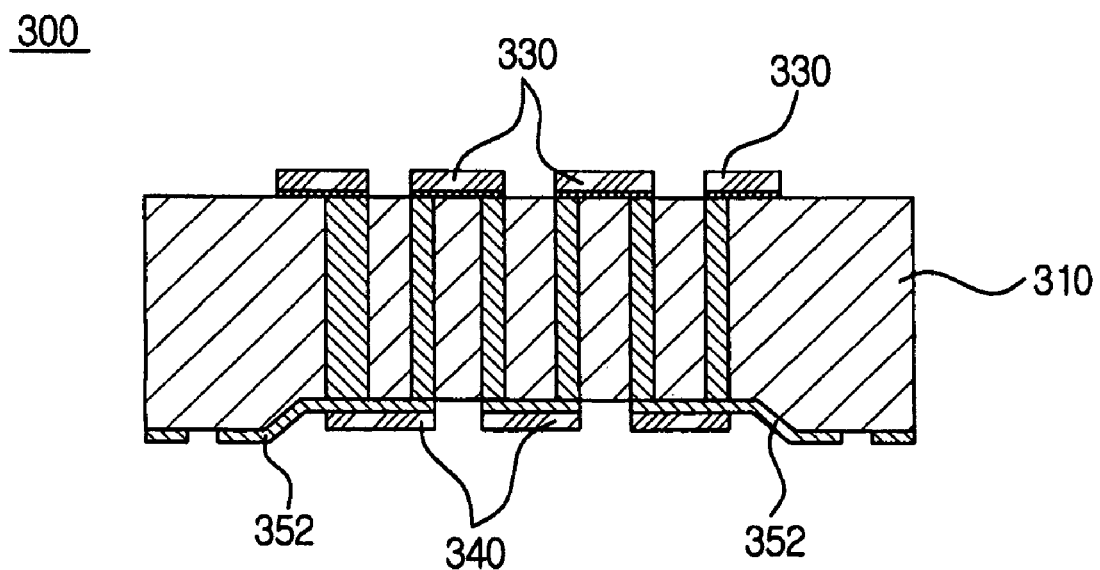

Referring to FIG. 17, after forming the second horizontal conductive portions 340, the second photo etching pattern 374 and the lower seed metal layer 384 below the second photo etching pattern 374 are removed. The lower seed metal layer 384 is removed and a lower seed pattern 352 remains. The lower seed pattern 352 is interposed between the second horizontal conductive portions 340 and the upper substrate 310.

For reference, since an electroplating process is performed in the present exemplary embodiment, after forming a seed metal layer, the seed metal layer is partially removed according to a pattern. However, in the case of electroless plating, after forming a seed metal pattern from the seed metal layer, plating metal may grow by using the seed metal pattern as a medium.

Figure 18:
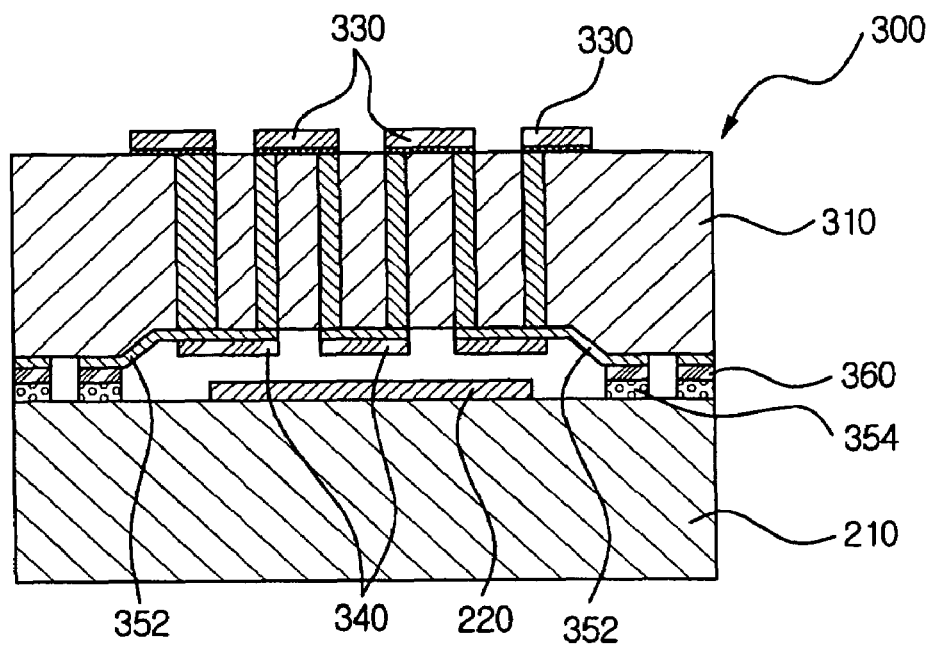
FIG. 18 is a cross-sectional view illustrating an inductor and a packaging structure according to an exemplary embodiment of the present invention.

FIG. 18 is a cross-sectional view illustrating an inductor 300 and a packaging structure 200 according to an exemplary embodiment of the present invention. For reference, the inductor 300 manufactured via the processes of FIGS. 10 through 17 may be installed in the packaging structure 200.

Referring to FIG. 18, the inductor 300 is installed on the base substrate 210 including the internal device 220. An outer block of the upper substrate 310 and the base substrate 210 is maintained to be hermetically sealed by sealing portions 360 and an electrode structure is formed to connect the internal device 220 and the inductor 300.

The packaging structure 200 includes a base substrate 210 including the internal device 220 and the inductor 300. The inductor 300 includes the upper substrate 310 for hermetically sealing the internal device 220, the vertical conductive portions 320 filling the via holes, the first and second horizontal conductive portions 330 and 340 connecting the vertical conductive portions 320 to form the coil structure, and an electrode portion for electrically connecting the coil structure and the internal device 220. As described above, a cavity is formed below the inductor 300 to contain the internal device 220.

Also, as illustrated, the electrode portion includes an extended electrode 352 formed beneath the inductor 300 and a connection electrode 354 formed on the base substrate 210. The extended electrode 352 is a portion extending from the second horizontal conductive portions 340 to be electrically connected to the coil structure. In response to this, the connection electrode 354 is electrically connected to the internal device 220. Accordingly, in a process of packaging, the extended electrode 352 is electrically connected to the connection electrode 354, and the inductor 300 may function as a part of a circuit formed by the internal devices 220 by the connection between the extended electrode 352 and the connection electrode 354.

As an additional process for packaging, a process of depositing materials for eutectic bonding may be performed. In addition, after forming solders via a process of lift-off, the packaging is completed directly on a wafer.

Figure 19:
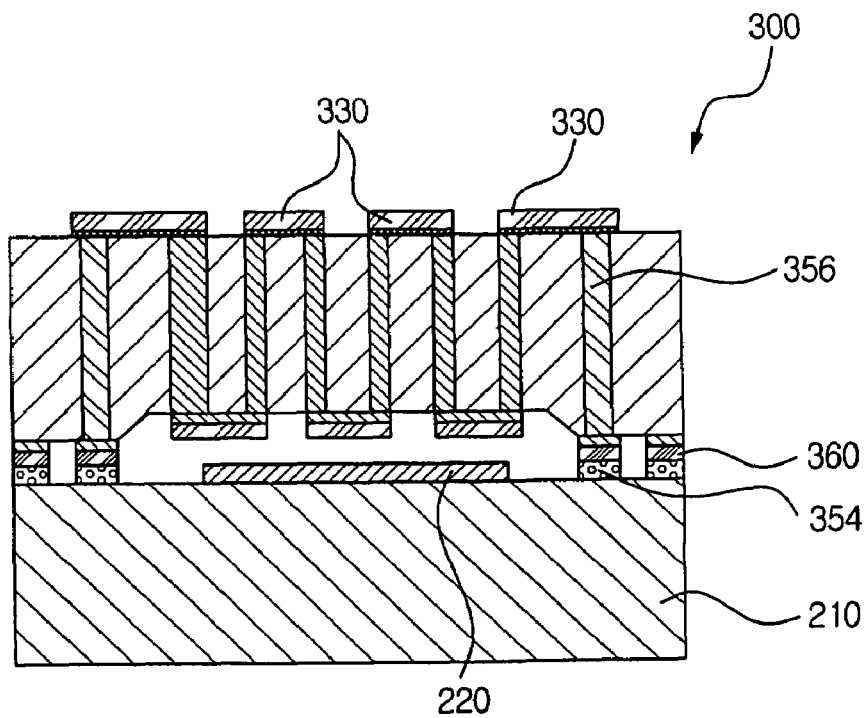
FIG. 19 is a cross-sectional view illustrating an inductor and a packaging structure according to an exemplary embodiment of the present invention.

FIG. 19 is a cross-sectional view illustrating the inductor 300 and a packaging structure 201 according to an exemplary embodiment of the present invention. For reference, the inductor 300 manufactured via the processes of FIGS. 10 through 17 may be installed on the packaging structure 201.

Referring to FIG. 19, an electrode portion includes via electrodes 356 formed in the inductor 300 and connection electrodes 354 formed on the base substrate 210. The via electrodes 356 are formed vertically passing through the upper substrate 310 and are electrically connected to a coil structure via the first horizontal conductive portions 330. The connection electrodes 354 are electrically connected to the internal device 220. Accordingly, in the packaging process, the via electrodes 356 are electrically connected to the connection electrodes 354, and the inductor 300 may function as a part of a circuit formed by the internal device 220 through the connection between the via electrodes 356 and the connection electrodes 354.

The inductor of the exemplary embodiment of the present invention may embody microminiaturization and may have an excellent property having a high quality factor.

Also, a defect rate is low because the inductor is easily manufactured, and manufacturing cost is low because the manufacturing process is not difficult.

Also, since horizontal conductive portions and the vertical conductive portions form a single body with a substrate, and is not a floating structure, the inductor has excellent durability against external impacts. In addition, the inductor has easy packaging design and chip design.

Also, since it is easy to install an inductor together with other devices, and a packaging is completed at the same time with the installation of an inductor, requirements on design conditions of the packaging may be decreased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An inductor comprising:
    a substrate comprising:
        a plurality of vertically formed via holes;
        a plurality of vertical conductive portions filling each of the via holes; and
        a plurality of first horizontal conductive portions and a plurality of second horizontal conductive portions , wherein each of the first and second horizontal conductive portions connect two of the vertical conductive portions at a top and a bottom of the substrate, respectively; and
    wherein one of the vertical conductive portions is connected to two other vertical conductive portions, wherein the two other vertical conductive portions are separated from each other at the top and the bottom of the substrate, wherein the vertical conductive portions and the first and second horizontal conductive portions form a single coil structure; and
    an electrode portion formed in a first end and a second end of the coil structure.

2. The inductor of claim 1, wherein the substrate is a high resistance silicone substrate.

3. The inductor of claim 1, wherein the plurality of via holes are disposed in two rows along the substrate, and each of the first horizontal conductive portions connect two of the vertical conductive portions, wherein the connected vertical conductive portions are in a different row from each other and are across from each other, at the top or bottom of the substrate, respectively.

4. The inductor according to claim 1, wherein the substrate has an insulating property and wherein the vertical conductive portions and the first and second horizontal conductive portions are formed of conductive material.

5. The inductor of claim 1, wherein when the substrate is an upper substrate of a packaging for a device, a cavity sinking to a predetermined depth from a second surface of the substrate opposite the device is formed to provide an operation space for the device.

6. The inductor according to claim 5, wherein the device comprises a micro device.

7. A packaging structure comprising:
    a base substrate on which a device is formed;
    an upper substrate hermetically sealing the device and covering the base substrate, comprising at least four via holes, vertically formed and disposed in two rows along the upper substrate;
    a plurality of vertical conductive portions packed in the via holes;
    a plurality of first horizontal conductive portions, pairing two of the vertical conductive portions located in an independent row and across from each other, and electrically connecting the two vertical conductive portions to a first side of the upper substrate;
    a plurality of second horizontal conductive portions pairing two of the vertical conductive portions located in an independent row and diagonally across from each other, and electrically connecting the two vertical conductive portions to a second side of the upper substrate, and forming a single coil structure with the vertical conductive portions and the first horizontal conductive portions; and
    an electrode portion which electrically connects the coil structure to the device.

8. The packaging structure of claim 7, wherein the upper substrate is formed of high resistance material.

9. The packaging structure of claim 7, wherein the electrode portion is formed on a first end and a second end of the coil structure and comprises a via electrode penetrating the upper substrate and a connection electrode formed on the base substrate and electrically in contact with the via electrode.

10. The packaging structure of claim 7, wherein the electrode portion is formed on a first end and a second end of the coil structure and comprises extended electrodes electrically connected to the coil structure on the second side of the upper substrate and a connection electrode formed on the base substrate to be electrically in contact with the extended electrode.

11. The packaging structure of claim 7, wherein a cavity sinking to a predetermined depth is formed on the second side of the upper substrate in order to contain the device for packaging.

12. The packaging structure of claim 7, wherein the device is a microelectromechanical system device.

13. The packaging structure of claim 7, wherein the microelectromechanical system device is one of a micro switch and a high-frequency duplexer.

14. The packaging structure according to claim 7, wherein a plurality of devices are formed on the base substrate.

15. The packaging structure according to claim 7, wherein the upper substrate has an insulating property.

16. The packaging structure according to claim 7, wherein the first and second horizontal conductive portions are formed of conductive material.

* * * * *